United States Patent
Hsu

(10) Patent No.: US 6,432,748 B1
(45) Date of Patent: Aug. 13, 2002

(54) SUBSTRATE STRUCTURE FOR SEMICONDUCTOR PACKAGE AND MANUFACTURING METHOD THEREOF

(75) Inventor: Shih-Ping Hsu, TaoYuan (TW)

(73) Assignee: Phoenix Precision Technology Corp., Hsinchu (TW)

( * ) Notice: Subject to any disclaimer, the term of this patent is extended or adjusted under 35 U.S.C. 154(b) by 0 days.

(21) Appl. No.: 09/962,282

(22) Filed: Sep. 24, 2001

(51) Int. Cl.$^7$ .................. H01L 21/44; H01L 21/48; H01L 21/50

(52) U.S. Cl. .............. 438/121; 438/106; 438/108; 29/852; 174/255; 174/262; 174/266; 174/267; 361/760; 361/761; 361/764

(58) Field of Search .................. 438/106, 108, 438/121; 29/852; 174/255, 262, 266, 267; 361/760, 761, 764

(56) References Cited

U.S. PATENT DOCUMENTS 5,989,935 A * 11/1999 Abbott ................. 438/106
6,228,676 B1 * 5/2001 Glenn et al. ............. 438/107
6,261,869 B1 * 7/2001 Radford et al. .......... 438/123

* cited by examiner

Primary Examiner—David L. Talbott
Assistant Examiner—David A Zarneke

(57) ABSTRACT

Disclosed is a structure of substrate and a fabricating method for IC (integrated circuit) chip package. Selected areas of the copper plate are etched for forming the plural conducting columns, and then an insulating layer is laminated to said copper plate to make said conducting columns embedded into said insulating layer. After portions of said insulating layer are removed for forming the plural blind vias each corresponding to exposed conducting columns, both said plural blind vias and the upper surface of said insulating layer are plated with a copper layer. An upper circuit layer and a lower circuit layer formed by etching said copper layer and said copper plate are covered with solder mask layers for protecting the substrate.

19 Claims, 8 Drawing Sheets

SUBSTRATE STRUCTURE FOR SEMICONDUCTOR PACKAGE AND MANUFACTURING METHOD THEREOF

BACKGROUND OF THE INVENTION

1. Field of Invention

The present invention relates to a structure of a substrate and to a method of fabricating the substrate with simplified fabrication process in low cost and high reliability. More particularly, the present invention relates to a structure of a substrate where an upper circuit layer and a lower circuit layer are electrically connected by a plurality of blind vias each corresponding to the conducting columns and to a method of fabricating this substrate.

2. Description of Related Art

After several hundreds of processing steps are performed on a chip, integrated circuits with complicated and particular functions are formed on the chip. However, the chip isn't still incorporated into circuits of a printed circuit board (PCB) until a package step for mounting it on a substrate is performed.

FIG. 1 is a schematic, cross-sectional diagram of a conventional IC package. Referring to FIG. 1, a substrate 10, an upper circuit layer 60a, a lower circuit layer 60b, and a plurality of the plated through holes 50 are provided.

The substrate 10 is made of an insulating material. The upper circuit layer 60a is formed on the upper surface of the substrate 10, and the lower circuit layer 60b is formed on the lower surface of the substrate 10. The upper circuit layer 60a is electrically coupled to the lower circuit layer 60b by a plurality of the plated through holes 50 which punch through the substrate 10. Both circuit layers 60a, 60b are covered with a layer of solder mask 70 that electrically isolates the conductive traces from each other and from the environment and contains a number of holes that expose the bonding pads (not shown) of the upper circuit layer 60a and the solder pads (not shown) of the lower circuit layer 60b. A chip 20 is mounted on the substrate 10 and electrically coupled to the bonding pads of the substrate 10 by the golden wires 40, while being packaged. The chip 20 and the golden wires 40 are sealed in the packaging material 30, such as encapsulate. The plural solder balls 80 are attached on the solder pads of the lower circuit layer 60 band then the substrate 10 is incorporated into a printed circuit board (PCB) by said plural solder balls 80.

Referring to FIGS. 2A–2D, a conventional method of fabricating a substrate for semiconductor package comprises the following steps.

(a) An insulating substrate 100 is provided. A plurality of the through holes 105 is formed through the substrate 100 by laser drilling.

(b) The top and the bottom of the substrate and the internal surface of the through holes 105 are respectively plated with copper for forming the copper layers 110,120, and the plated through holes 105a.

(c) The copper layers 110, 120 are etched respectively to form an upper and lower circuit layers 110a, 120a. The upper circuit layer 110a is electrically conducted to the lower circuit layer 120a by the plated through holes 105a.

(d) The plated through holes 105a are plugged with the pastes such as an insulating resin or the conducting epoxy 140.

(e) The upper and lower circuit layers 110a, 120a of the substrate 100 are covered with a layer of solder mask 150 containing a number of holes that expose defined areas for the bonding pads and the ball pads.

When conventional arts, such as above-mentioned method, are required to form a micro via and a thinner substrate (the thickness is between 0.1 millimeter and 0.04 millimeter), a problem of voids arises. The voids produced during the plugging step are harmful to the reliability test, and it is hard to keep a constant quality.

SUMMARY OF THE INVENTION

The objective of the present invention is to provide a method and a structure of fabricating a substrate for integrated circuit package to avoid the occurrence of voids generated in the plugging step in prior art. The etching and plating methods are adapted to an insulating layer and a copper plate for electrically interconnecting the circuit layers, and the plugging step is not required and could be omitted, thus the reliability is enhanced.

Another objective of the present invention is to provide a structure of substrate for integrated circuit package, which comprises an insulating layer, an upper circuit layer, and a lower circuit layer. The circuit layers are formed on the upper and lower surfaces of said insulating layer, and the circuit layers could be electrically connected to each other by a plurality of blind vias each corresponding to the conducting columns embedded into said insulating layer.

To achieve the above-mentioned goal, the present invention offers a fabricating method of a substrate for packaging integrated circuit. The steps are as follows:

(a) A copper plate defined by etching is provided to form the plural conducting columns.

(b) An insulating layer and said copper plate are laminated together, so the conducting columns are embedded into the insulating layer.

(c) Portions of the insulating layer are removed at the defined areas which are located on the conducting columns to form the plural blind vias.

(d) The upper surface of the insulating layer and the plural blind vias are plated with a copper layer.

The copper layer on the surface of the insulating layer and the copper plate are etched for forming an upper and a lower circuit layer.

The upper and lower circuit layers are covered respectively with solder mask layers.

In another variation of the present invention, after the blind vias are plated with copper not fully, the plural solder bumps could be formed on the plural blind vias for attaching a chip.

BRIEF DESCRIPTION OF THE DRAWINGS

The invention will be described in greater detail with reference to the accompanying drawings for further understanding.

DETAILED DESCRIPTION OF A PREFERRED EMBODIMENT

Figure 1:
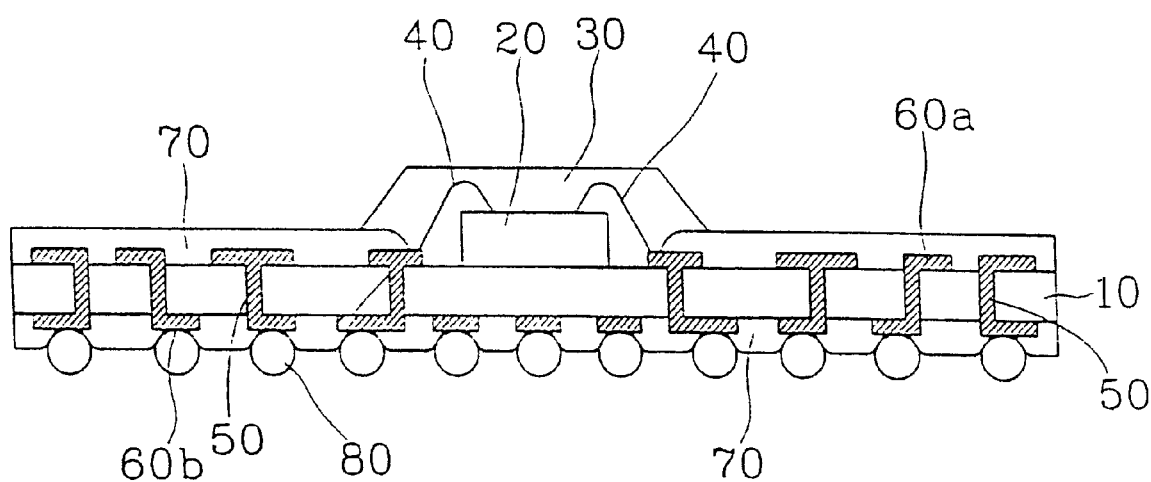
FIG. 1 is a schematic, cross-sectional diagram of a conventional IC package.
Figure 2A:
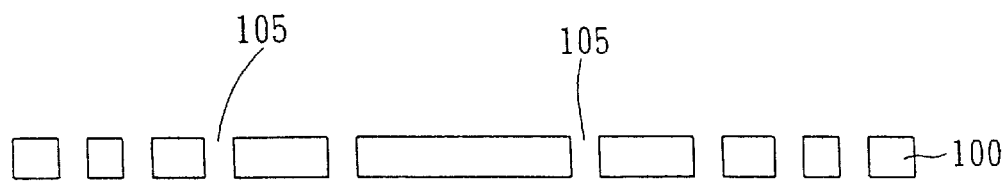
FIGS. 2A–2D are schematic, cross-sectional diagrams of a conventional method of fabricating a substrate for semiconductor package.
Figure 2B:
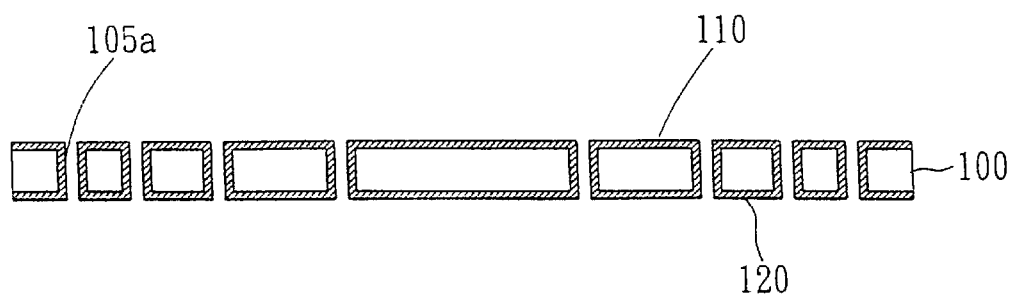
Figure 2C:
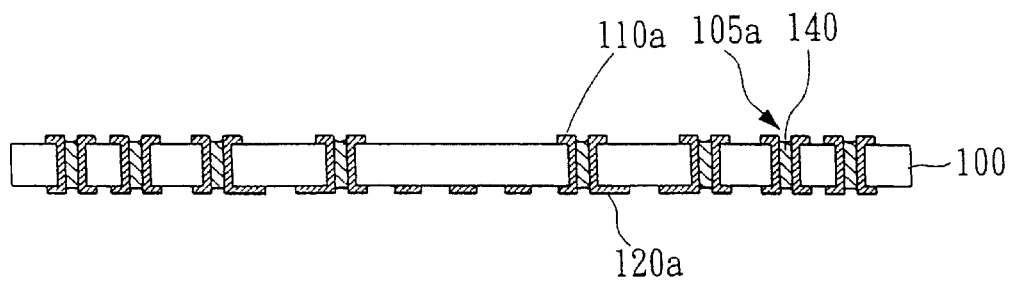
Figure 2D:
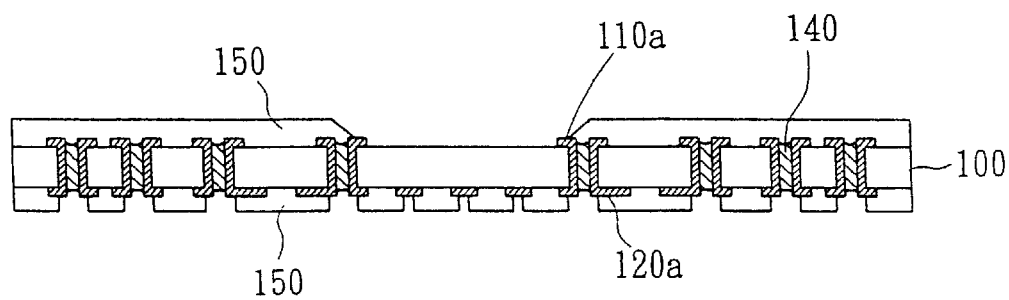

Three embodiments are illustrated in the following description in order to clearly describe the substrate structure for semiconductor package in the invention and the manufacturing method thereof.

First Embodiment

Referring to FIGS. 3A–3G, the method of fabricating a substrate for IC package according to the first embodiment of the invention is as follows.

(a) A copper plate 200 defined by photolithography and etching is provided to form the plural conducting columns 210 of which the surfaces are roughened through microetching to enhance adhesion ability.

(b) An insulating layer 220 and said copper plate 200 are laminated together, so the conducting columns 210 are embedded into the insulating layer 220. The material of above-mentioned insulating layer 220 could be prepreg with glass fiber or thicker insulating resin.

(c) The portions of the insulating layer 220 are removed by laser drilling for forming the plural blind vias 230 each corresponding to the expose conducting columns 210. The surfaces of the exposed conducting columns 210 are cleaned to be free from the insulating residue and are prepared to accept plating thereon in next step.

(d) The upper surface of the insulating layer 220 is plated with a copper layer 240, and the blind vias 230 are also plated full with copper to form the electrically conductive vias 230a.

(e) The copper plate 200 and the copper layer 240 on the insulating layer 220 are etched respectively for forming the lower circuit layer 200a and the upper circuit layer 240a.

(f) The upper and lower circuit layers 240a, 200a are covered respectively with a solder mask layer 250 that offers electrical isolation for circuit layers 240a, 200a and contains a number of holes that expose the bonding pads (not shown) and the ball pads. The exposed areas could be plated with a layer made of metal (not shown), like nickel, gold, etc. thereon. The solder mask layers 250 could be anti-soldering material or insulating resin.

Figure 3A:
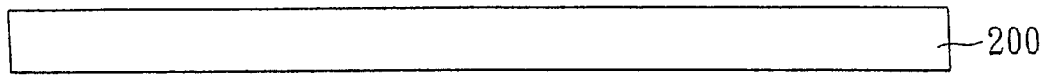
FIGS. 3A–3H are schematic, cross-sectional diagrams of fabricating a substrate for semiconductor package according to the first preferred embodiment of this invention.
Figure 3B:
Figure 3C:
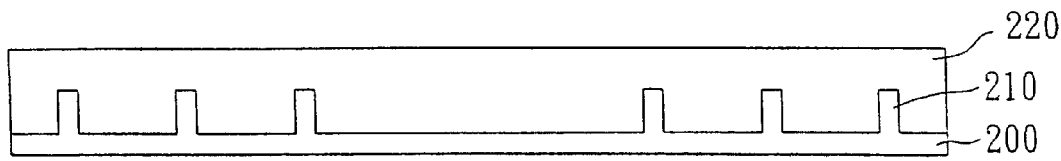
Figure 3D:
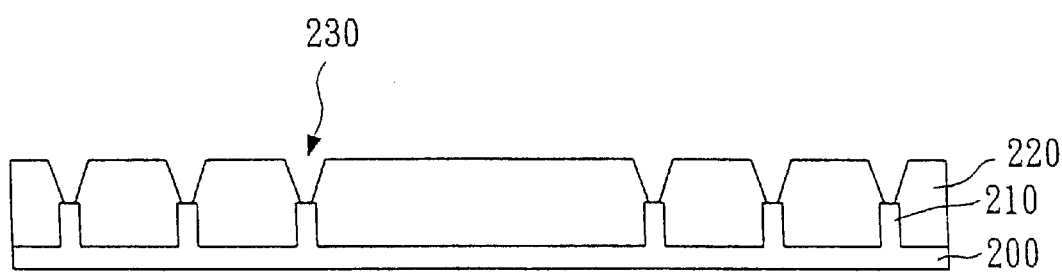
Figure 3E:
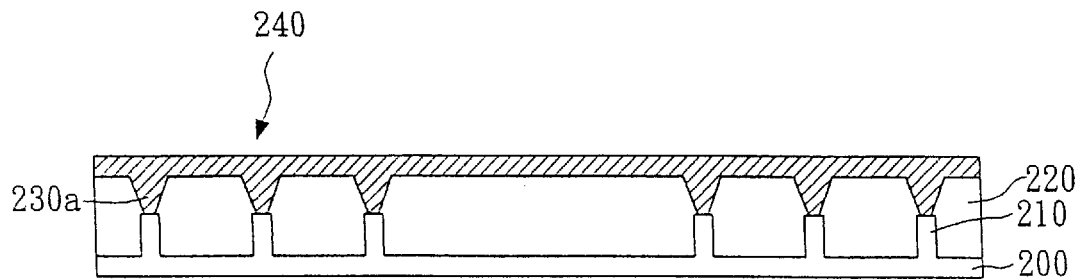
Figure 3F:
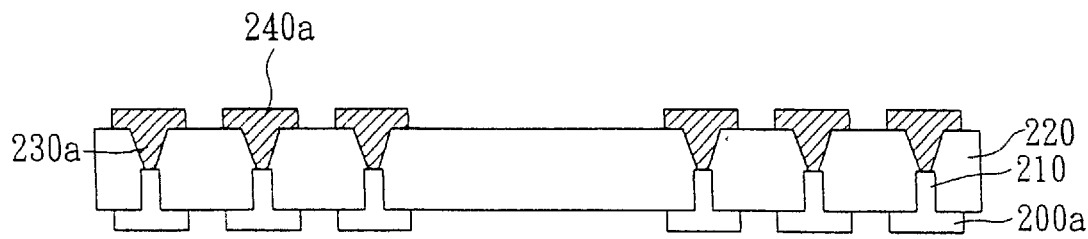
Figure 3G:
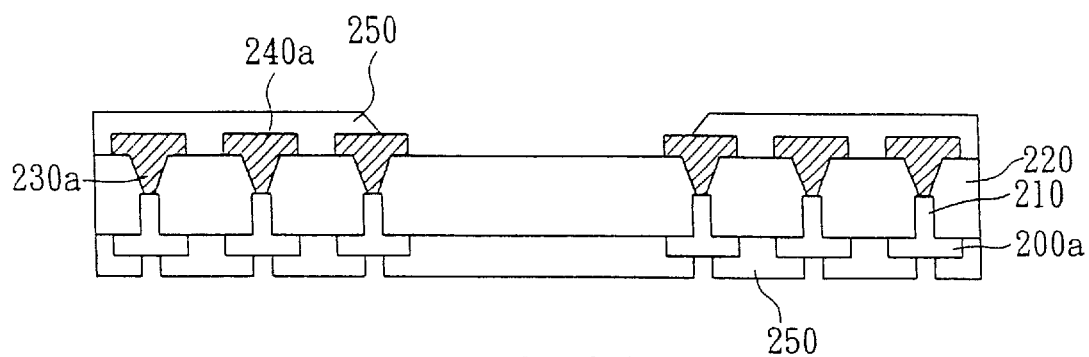
Figure 3H:
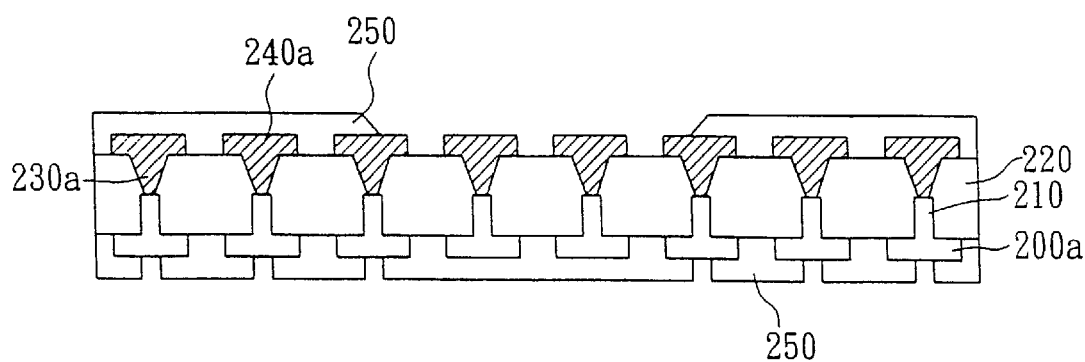

In another variation of the first embodiment as shown in FIG. 3H, after the upper and lower circuit layers 240a, 200a are covered respectively with a solder mask layer 250 having selected areas exposed for the bonding pads and the ball pads. The exposed areas are plated with metal layer thereon i.e. nickel, gold, etc. (not shown). Such variation could apply to flip-chip package.

Second Embodiment

Referring to FIGS. 4A–4G, the steps of fabricating a substrate for IC package according to the second embodiment of the present invention are detailed as follows.

(a) A copper plate 300 defined by photolithography and etching is provided to form the plural conducting columns 310 of which the surfaces are roughened through microetching to enhance adhesion ability.

(b) An insulating layer 320 and said copper plate 300 are laminated together, so the conducting columns 310 are embedded into the insulating layer 320. The material of above-mentioned insulating layer 320 could be prepreg with glass fiber or thicker insulating resin.

(c) The portions of the insulating layer 320 are removed by laser drilling for forming the plural blind vias 330 each corresponding to the exposed conducting columns 310. The surfaces of the exposed conducting columns 310 are cleaned to be free from insulating residue and are prepared to accept plating thereon in next step.

(d) The upper surface of the insulating layer 320 is plated with a copper layer 340, and the blind vias 330 are also plated not full with copper to form the electrically conductive vias 330a.

(f) The copper plate 300 and the copper layer 340 on the insulating layer 320 are etched respectively for forming the lower circuit layer 300a and the upper circuit layer 340a.

(g) The upper and lower circuit layers 340a, 300a are covered respectively with a solder mask layer 350 that offers electrical isolation for circuit layers and contains a number of holes that expose the bonding pads (not shown) and the ball pads. The exposed areas could be plated with a layer made of metal (not shown), like nickel, gold, etc. thereon. The solder mask layers 350 could be anti-soldering material or insulating resin.

Figure 4A:
FIGS. 4A–4H are schematic, cross-sectional diagrams of fabricating a substrate for semiconductor package according to the second preferred embodiment of this invention.
Figure 4B:
Figure 4C:
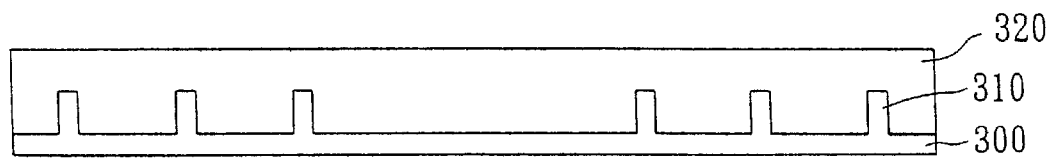
Figure 4D:
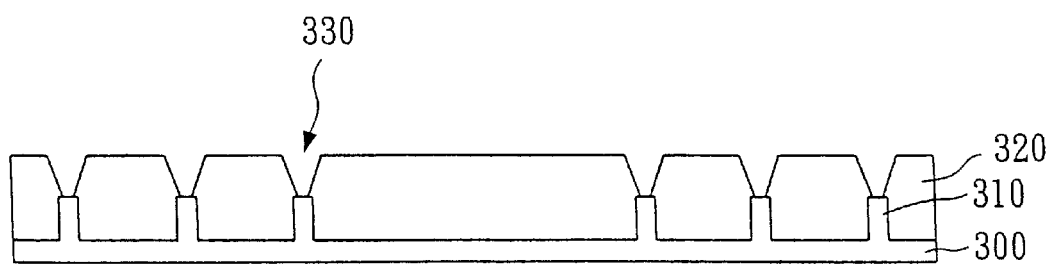
Figure 4E:
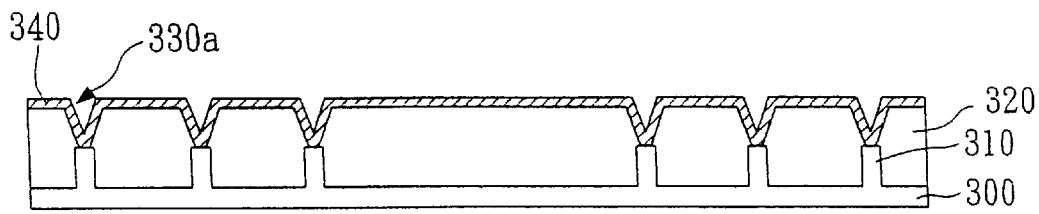
Figure 4F:
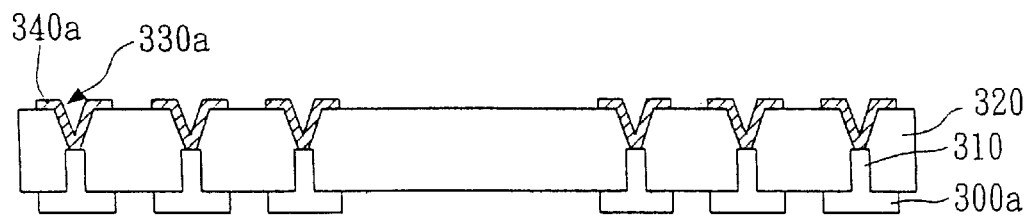
Figure 4G:
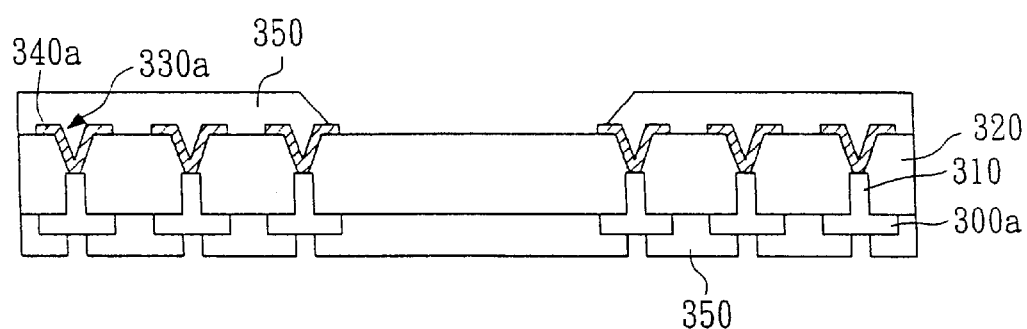

FIG. 3E of the first embodiment and FIG. 4E of the second embodiment show the different thickness of copper layer in blind vias. The blind vias are plated full with copper in the first embodiment. The blind vias 330 in the second embodiment are plated not full with copper, and then a solder mask layer 350 is employed to fill the electrically conductive vias 330a (not shown).

Figure 4H:
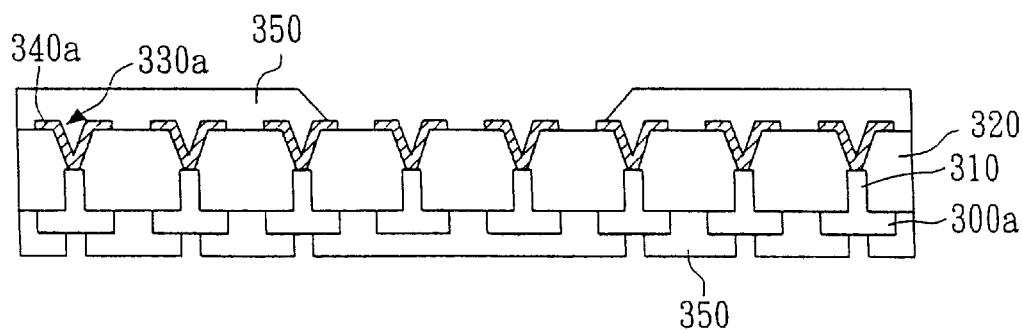

In another variation of the second embodiment as shown in FIG. 4H, the upper and lower circuit layers 340a, 300a are covered respectively with a solder mask layer 350 that has selected areas exposed for the bonding pads and the ball pads. The exposed areas are plated with metal layer made of nickel, gold, etc. (not shown). Such variation could apply to flip-chip package.

Third Embodiment

Referring to FIGS. 5A–5G, the steps of fabricating a substrate for IC package according to the third embodiment of the invention are as follows.

(a) A copper plate 400 defined by photolithography and etching is provided to form the plural conducting columns 410 of which the surfaces are roughened through microetching to enhance adhesion ability.

(b) An insulating layer 420 and said copper plate 400 are laminated together, so the conducting columns 410 are embedded into the insulating layer 420. The material of above-mentioned insulating layer 420 could be prepreg with glass fiber or thicker insulating resin.

(c) The portions of the insulating layer 420 are removed by laser drilling for forming the plural blind vias 430 each corresponding to the exposed conducting columns 410. The surfaces of the exposed conducting columns 410 are cleaned to be free from the insulating residue and are prepared to accept plating there upon in next step.

(d) The upper surface of the insulating layer 420 is plated with a copper layer 420, and the blind vias 430 are also plated not full with copper to form the electrically conductive vias 430a.

(e) The copper plate 400 and the copper layer 440 on the insulating layer 420 are etched for forming the lower circuit layer 400a and the upper circuit layer 440a.

(f) The upper and lower circuit layers 440a, 400a are covered respectively with a solder mask layer 450 that offers electrical isolation for circuit layers and contains a number of holes that expose the bonding pads (not shown) and the ball pads. The exposed areas could be plated with metal layers made of metal (not shown), like nickel, gold, etc. thereon. The solder mask layers 450 could be anti-soldering material or insulating resin.

(g) The plural electrically conductive vias 430a on which a chip is attached are covered with a thin film (not shown) which can conduct electricity, and then the plural solder bumps 460 could be formed therein.

Figure 5A:
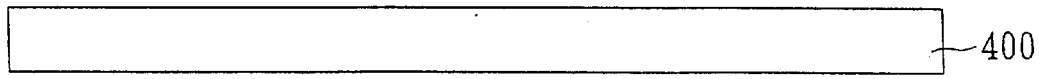
FIGS. 5A–5G are schematic, cross-sectional diagrams of fabricating a substrate for semiconductor package according to the third preferred embodiment of this invention.
Figure 5B:
Figure 5C:
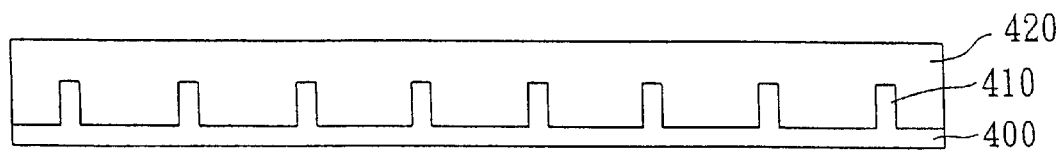
Figure 5D:
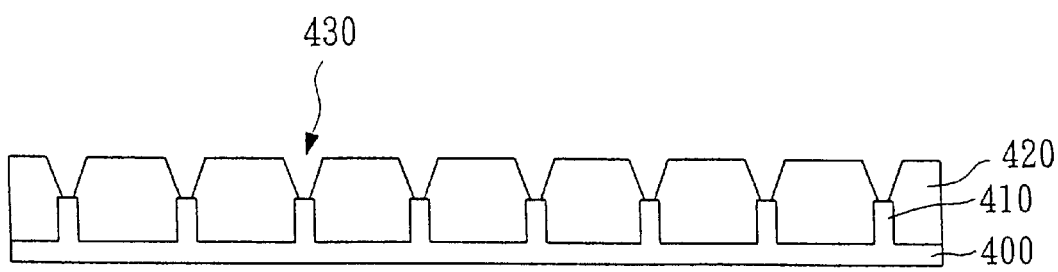
Figure 5E:
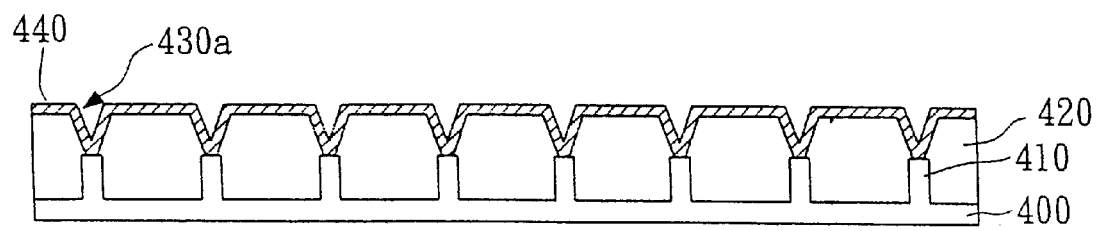
Figure 5F:
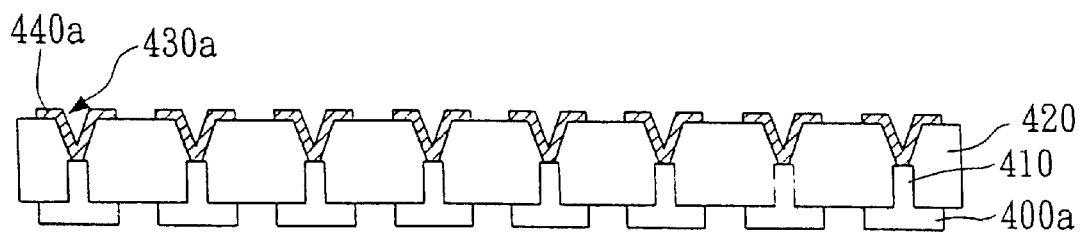
Figure 5G:
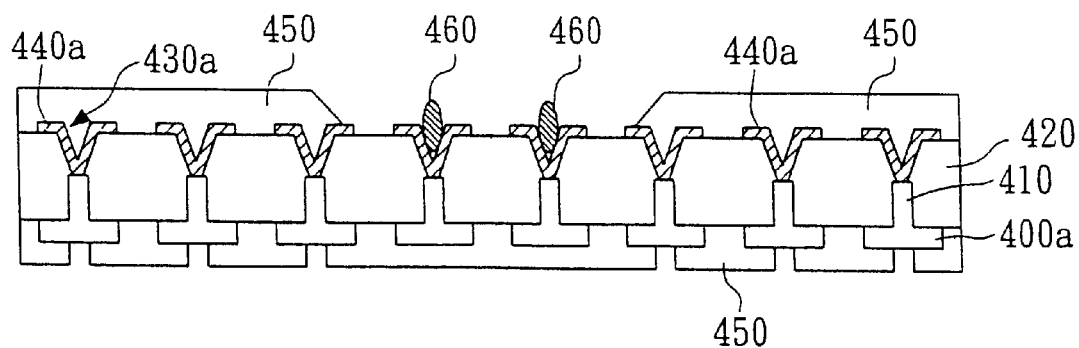

In comparison with the first embodiment and the second embodiment, the third embodiment as shown in FIG. 5G takes different approaches to achieve electrical interconnection between a chip and a substrate, the plural solder bumps 460 formed in the electrically conductive vias 430a could contact a chip directly.

The main advantage of the present invention described above is its simplicity. The fabrication process for a substrate is accomplished by photolithography, etching, and electroplating for electrically interconnecting copper plate and insulating layer. The requirement on plugging vias is not necessary, thus overcoming voids problems, which enhances the quality of electrical connection and brings higher reliability and better performance with low cost. Because the conducting columns are made of copper, the efficiency of heat dissipation can be enhanced.

Preferred embodiments of the invention have been described as above. The descriptions are intended to be illustrative, and not limitative. It will be clearly understood by those skilled in the art that various changes in form and detail maybe made therein without departing from the true spirit and scope of the invention as defined by the appended claims.

Therefore, the following claims define the scope of the protection afforded by the patent.

What is claimed is:

1. A method for fabricating a substrate for integrated circuit packages, said method comprising the steps of:
   (a) providing a copper plate, forming the plural conducting columns on defined areas of said copper plate by etching;
   (b) laminating an insulating layer and said copper plate together, said plural conducting columns are embedded into said insulating layer;
   (c) removing portions of said insulating layer for forming the blind vias each corresponding to said conducting columns;
   (d) plating the upper surface of said insulating layer with a copper layer, and said blind vias are also plated full with copper;
   (e) etching said copper layer on the surface of said insulating layer and said copper plate respectively for forming an upper circuit layer and a lower circuit layer;
   (f) covering said upper circuit layer and lower circuit layers respectively with solder mask layers.

2. The method of claim 1, wherein the material of said insulating layer is made of prepreg with glass fiber or thicker insulating resin.

3. The method of claim 1, wherein step (c) is the step of removing the portions of said insulating layer by laser drilling.

4. The method of claim 1, wherein further comprising after step (f) the step of:
   exposing defined areas of said solder mask layers for pads, and then plating said defined areas with a metal layer.

5. The method of claim 4, wherein the pads are chosen from a group consisting of the bonding pads and the ball pads.

6. The method of claim 4, wherein said metal layer at least comprises nickel.

7. The method of claim 4, wherein said metal layer at least comprises gold.

8. A method for fabricating a substrate for integrated circuit packages, said method comprising the steps of:
   (a) providing a copper plate, forming the plural conducting columns on defined areas of said copper plate by etching;
   (b) laminating an insulating layer and said copper plate together, said plural conducting columns are embedded into said insulating layer;
   (c) removing portions of said insulating layer for forming the blind vias each corresponding to said conducting columns;
   (d) plating the upper surface of said insulating layer with a copper layer, and said blind vias are also plated not full with copper;
   (e) etching said copper layer on the surface of said insulating layer and said copper plate for forming an upper circuit layer and a lower circuit layer;
   (f) covering said upper circuit layer and lower circuit layer respectively with solder mask layers.

9. The method of claim 8, wherein the material of said insulating layer is made of prepreg with glass fiber.

10. The method of claim 8, wherein the material of said insulating layer is made of thicker insulating resin.

11. The method of claim 8, wherein step (c) is the step of removing the portions of the insulating layer by laser drilling.

12. The method of claim 8, wherein further comprising after step (f) the step of:
    exposing defined area of said solder mask layers for the bonding pads and the ball pads; and plating said defined areas with a metal layer.

13. The method of claim 12, wherein said metal layer at least comprises nickel.

14. The method of claim 12, wherein said metal layer at least comprises gold.

15. A method for fabricating a substrate for integrated circuit packages, said method comprising the steps of:
    (a) providing a copper plate, forming the plural conducting columns on said defined areas of said copper plate by etching;
    (b) laminating an insulating layer and said copper plate together, said plural conducting columns are embedded into said insulating layer;
    (c) removing portions of said insulating layer for forming the blind vias each corresponding to said conducting columns;
    (d) plating the upper surface of said insulating layer with a copper layer, and said blind vias are also plated not full with copper;
    (e) etching said copper layer on the surface of said insulating layer and said copper plate respectively for forming an upper circuit layer and a lower circuit layer;
    (f) covering said upper circuit layer and lower circuit layers respectively with solder mask layers;
    (g) forming the plural solder bumps on said plural blind vias for mounting a chip.

16. The method of claim 15, wherein the material of said insulating layer is made of prepreg with glass fiber.

17. The method of claim 15, wherein the material of said insulating layer is made of thicker insulating resin.

18. The method of claim 15, wherein step (c) is the step of removing portions of the insulating layer by laser drilling.

19. The method of claim 15, wherein further comprising before step (f) the step of plating plural blind vias with a thin electrically conductive film for attaching a chip.

* * * * *